US006576148B1

(12) United States Patent
Shum et al.

(10) Patent No.: US 6,576,148 B1
(45) Date of Patent: Jun. 10, 2003

(54) NON-HOMOGENEOUS LAMINATE MATERIAL FOR SUSPENSION WITH ELECTROSTATIC DISCHARGE SHUNTING

(75) Inventors: Victor Wing-Chun Shum, San Jose, CA (US); Randall George Simmons, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 238 days.

(21) Appl. No.: 09/259,890

(22) Filed: Feb. 22, 1999

(51) Int. Cl.[7] .................................. B44C 1/22
(52) U.S. Cl. ..................... 216/13; 216/22; 216/56; 216/99; 216/100; 216/105; 360/137; 360/245.9
(58) Field of Search ...................... 216/13, 22, 56, 216/99, 100, 105, 83; 360/245.9, 137

(56) References Cited

U.S. PATENT DOCUMENTS

| 3,582,599 A | * | 6/1971 | Yohn ........................ 219/60 R |
| 4,906,803 A | * | 3/1990 | Albrechta et al. ........... 174/254 |
| 5,041,319 A | * | 8/1991 | Becker et al. ............... 428/71 |
| 5,474,227 A | * | 12/1995 | Krengel et al. ............. 228/147 |
| 5,598,307 A | * | 1/1997 | Bennin ...................... 360/104 |
| 5,680,274 A | * | 10/1997 | Palmer ...................... 360/104 |
| 5,712,749 A | * | 1/1998 | Gustafson ................... 360/104 |
| 5,732,874 A | * | 3/1998 | Borzym et al. ............. 228/147 |
| 5,812,357 A | * | 9/1998 | Johansen .................... 361/212 |
| 5,839,193 A | * | 11/1998 | Bennin et al. ............. 29/896.9 |
| 6,018,859 A | * | 2/2000 | Borzym et al. ............. 228/147 |
| 6,042,659 A | * | 3/2000 | Brown et al. .............. 148/519 |

FOREIGN PATENT DOCUMENTS

| GB | 2295918 A | * | 12/1996 | ....................... 5/48 |
| WO | WO 97/36290 | * | 10/1997 | ....................... 5/55 |

* cited by examiner

*Primary Examiner*—Randy Gulakowski
(74) *Attorney, Agent, or Firm*—Douglas R. Millett; Bracewell & Patterson, L.L.P.

(57) ABSTRACT

An integrated lead suspension is formed from a laminate of three materials in a variety of configurations having from three to five layers. The materials are stainless steel, polyimide and copper. Each layer is essentially homogeneous, but may be formed with one or more holes or voids prior to the formation of the laminate. The voids allow dielectric material to be removed from the area beneath the conductors to simplify processing and reduce the cost of the suspensions. The voids can also form a window through which conductors can be shorted to other conductive layers to form an electrostatic discharge shunt. Alternatively, the shorting of conductors can be used as a cross-over for various conductors.

13 Claims, 3 Drawing Sheets

NON-HOMOGENEOUS LAMINATE MATERIAL FOR SUSPENSION WITH ELECTROSTATIC DISCHARGE SHUNTING

TECHNICAL FIELD

This invention relates in general to integrated lead suspensions for hard disk drives and in particular to fabricating and applying non-homogenous laminate materials to integrated lead suspensions with ESD shunting.

BACKGROUND ART

In hard disk drive manufacturing, one type of head gimbal assembly has an integrated lead suspension (ILS). An ILS is typically formed by laminating several layers of material together and then selectively etching the layers to achieve a desired architecture. Alternatively, the layers may be formed by plating them on top of one another. These layers usually comprise at least one of each of the following: a stainless steel substrate or support layer, an insulation layer such as a polyimide, and a conductor layer such as copper. An ILS with a bent lead type design must be etched on both sides to clear the polyimide on the bent lead. This step requires additional process time and adds cost to the suspension.

In an ILS, the conductors carry the electrical signals from the read/write heads to a flexible cable. The polarity of the signals at the heads determines the polarity of the termination pads at the flexible cable since the conductors cannot cross over one another. This is a serious problem if multiple heads with different polarities must be connected to the same flexible cable which has only one set of polarities.

In addition, some sliders are especially sensitive to electrostatic discharge (ESD). One example is the giant magneto resistive (GMR) head, which can be easily damaged by an ESD event. ESD damage lowers manufacturing yield and increases the cost of the head gimbal assembly. Improved methods for manufacturing integrated lead suspensions are needed to address these issues.

DISCLOSURE OF THE INVENTION

An integrated lead suspension is formed from a laminate of three materials in a variety of configurations having from three to five layers. The materials are stainless steel, polyimide and copper. Each layer is essentially homogeneous, but may be formed with one or more holes or voids prior to the formation of the laminate. The voids allow dielectric material to be removed from the area beneath the conductors to simplify processing and reduce the cost of the suspensions. The voids can also form a window through which conductors can be shorted to other conductive layers to form an electrostatic discharge shunt Alternatively, the shorting of conductors can be used as a cross-over for various conductors.

BEST MODE FOR CARRYING OUT THE INVENTION

Figure 1:
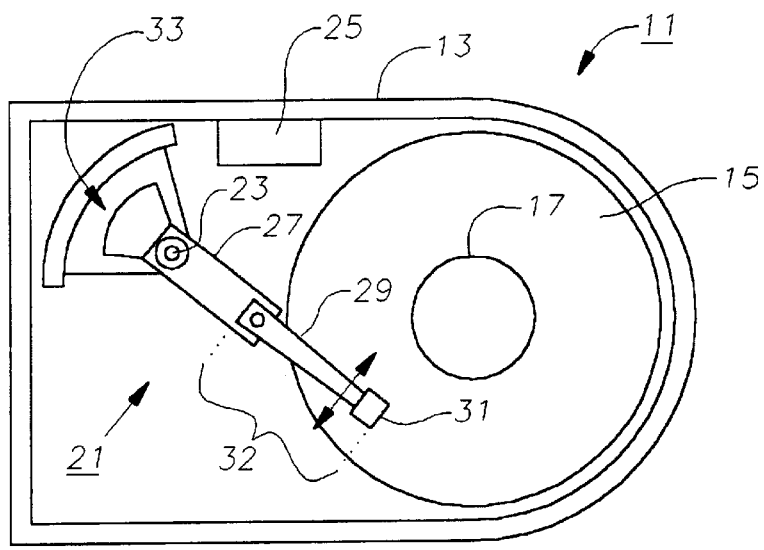
FIG. 1 is a schematic drawing of a hard disk drive.
Figure 2:
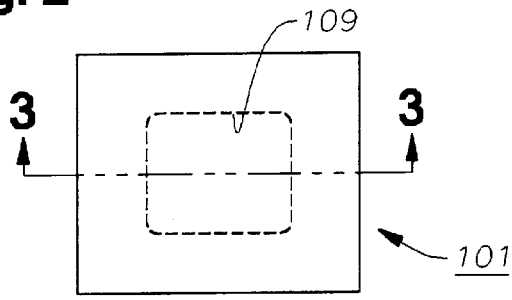
FIG. 2 is a plan view of a first embodiment of a suspension at an initial stage of processing and is constructed in accordance with the invention.
Figure 3:
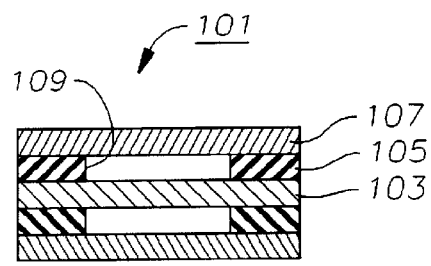
FIG. 3 is a sectional side view of the suspension of FIG. 2 taken along the line 3—3 of FIG. 2.

Referring to FIG. 1, a schematic drawing of an information storage system comprising a magnetic hard disk drive 11 is shown. Drive 11 has a base 13 containing a plurality of stacked, parallel magnetic disks 15 (one shown) which are closely spaced apart. Disks 15 are rotated by a motor located therebelow about a central drive hub 17. An actuator 21 is pivotally mounted to base 13 about a pivot assembly 23. A controller 25 is mounted to base 13 for selectively moving actuator 21 as will be described below.

Actuator 21 has a mounting support 27, a pair of parallel, cantilevered load beams or integrated lead suspensions 29 extending from mounting support 27, and a slider 31 having at least one magnetic read/write head secured to each suspension 29 for magnetically reading data from or magnetically writing data to disks 15. The union of a suspension 29 and a slider 31 forms a head gimbal assembly 32. Suspensions 29 have a spring-like quality which biases or maintains them in parallel relationship relative to one another. A motor assembly 33 having a conventional voice coil motor is also mounted to pivot assembly 23 opposite sliders 31. Movement of actuator 21 (indicated by arrows) moves sliders 31 radially across tracks on the disks 15 until the heads on assemblies 32 settle on the target tracks.

A first embodiment of the invention is shown in FIGS. 2–7. An integrated lead suspension 101 comprises a laminate of five layers and three materials: a central support layer of stainless steel 103, a dielectric layer of polymer or polyimide 105 on each side of steel 103, and a conductive layer of copper 107 on the outer surface of each polyimide 105. The laminate of suspension 101 can be formed by selectively etching away different layers, or by selectively plating and building the laminate layer by layer. In one version, polyimides 105 are etched by hot plasma, while steel 103 and coppers 107 are etched with a conventional wet chemical process.

Figure 4:
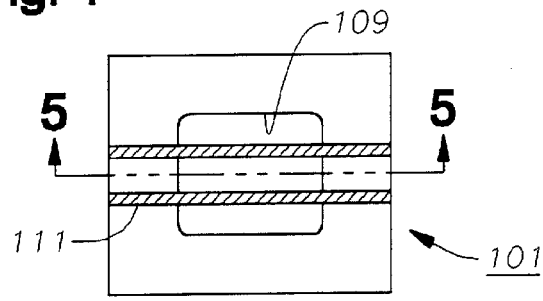
FIG. 4 is a plan view of the suspension of FIG. 2 at an intermediate stage of processing
Figure 5:
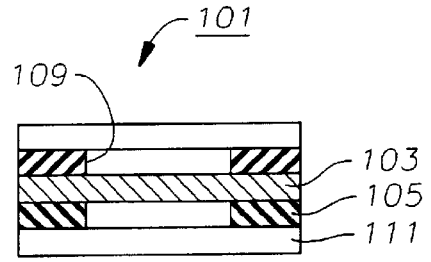
FIG. 5 is a sectional side view of the suspension of FIG. 4 taken along the line 5—5 of FIG. 4.
Figure 6:
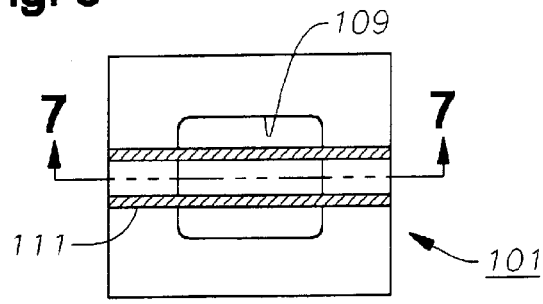
FIG. 6 is a plan view of the suspension of FIG. 2 after final processing.
Figure 7:
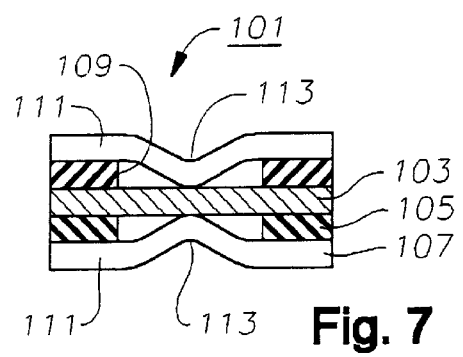
FIG. 7 is a sectional side view of the suspension of FIG. 6 taken along the line 7—7 of FIG. 6.
Figure 8:
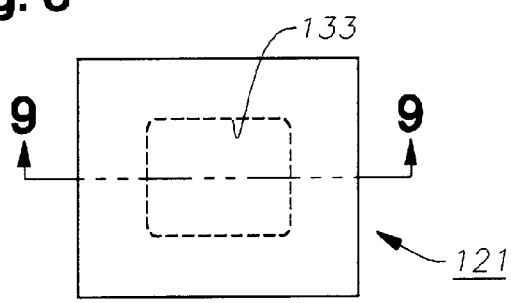
FIG. 8 is a plan view of a second embodiment of a suspension at an initial stage of processing and is constructed in accordance with the invention.
Figure 9:
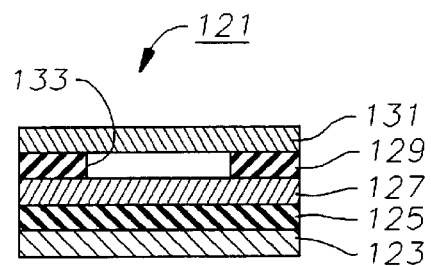
FIG. 9 is a sectional side view of the suspension of FIG. 8 taken along the line 9—9 of FIG. 8.

Prior to the formation of the laminate (FIGS. 2 and 3), polyimides 105 are preformed with voids 109 so that they are no longer homogeneous. Voids 109 may be formed by prestamping or pre-etching. After voids 109 are made, the laminate of suspension 101 is formed as described above. The copper layers 107 are subsequently etched to form traces or conductors 111 (FIGS. 4 and 5). In the next step, conductors 111 are deformed inward through voids 109 in polyimides 105 toward and into contact with steel 103 to form electrostatic discharge shunts 113 therebetween (FIGS. 6 and 7).

Referring to FIGS. 8–13, a second embodiment of the invention is shown. An integrated lead suspension 121 comprises a laminate of five layers and three materials: a support layer of stainless steel 123, a first dielectric layer of polymer or polyimide 125 on steel 123, a first conductive layer of copper 127 on polyimide 125, a second dielectric layer of polyimide 129 on copper 127, and a second conductive layer of copper 131 on polyimide 129. Alternatively, this configuration may be duplicated on the opposite side of steel 123 to form a nine-layer laminate (not shown). The laminate of suspension 121 can be selectively etched or plated layer by layer.

Figure 10:
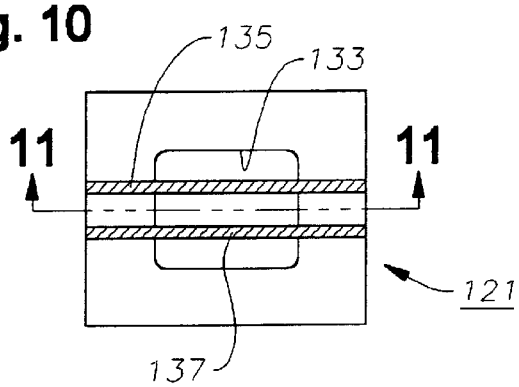
FIG. 10 is a plan view of the suspension of FIG. 8 at an intermediate stage of processing.
Figure 11:
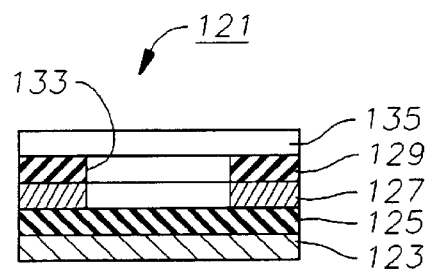
FIG. 11 is a sectional side view of the suspension of FIG. 10 taken along the line 11—11 of FIG. 10.
Figure 12:
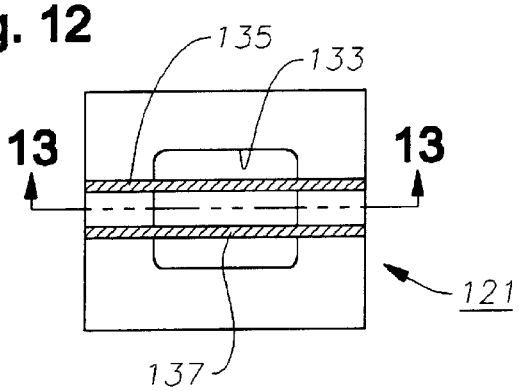
FIG. 12 is a plan view of the suspension of FIG. 8 after final processing.
Figure 13:
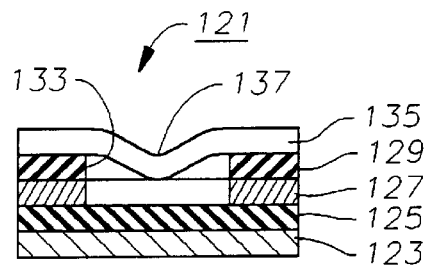
FIG. 13 is a sectional side view of the suspension of FIG. 12 taken along the line 13—13 of FIG. 12.
Figure 14:
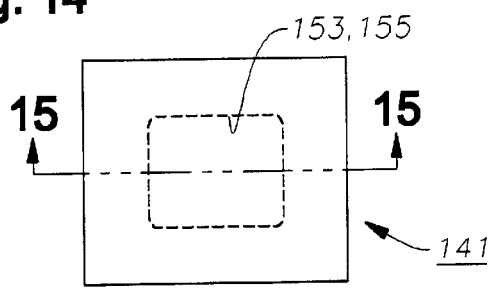
FIG. 14 is a plan view of a third embodiment of a suspension at an initial stage of processing and is constructed in accordance with the invention.
Figure 15:
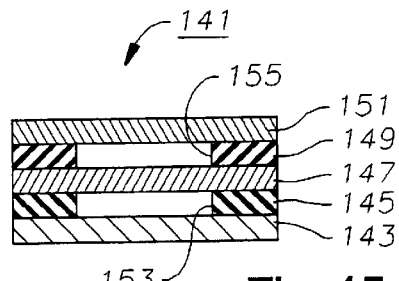
FIG. 15 is a sectional side view of the suspension of FIG. 14 taken along the line 15—15 of FIG. 14.

Prior to the formation of the laminate (FIGS. 8 and 9), polyimide 129 is preformed with at least one void 133. Void 133 may be formed by prestamping or pre-etching. After void 133 is made, the laminate of suspension 121 is formed. Coppers 127, 131 are subsequently etched to form conductors 135 (FIGS. 10 and 11). The next step in this embodiment is to deform the outer conductors 135 inward through void 133 toward and into contact with copper 127 to form electrostatic discharge shunts 137 therebetween (FIGS. 12 and 13).

Referring now to FIGS. 14–19, a third embodiment of the invention is shown. An integrated lead suspension 141 comprises a laminate of five layers and three materials: a support layer of stainless steel 143, a first dielectric layer of polymer or polyimide 145 on steel 143, a first conductive layer of copper 147 on polyimide 145, a second dielectric layer of polyimide 149 on copper 147, and a second conductive layer of copper 151 on polyimide 149. Alternatively, this configuration may be duplicated on the opposite side of steel 123 to form a nine-layer laminate (not shown). The laminate of suspension 141 can be selectively etched or plated layer by layer.

Figure 16:
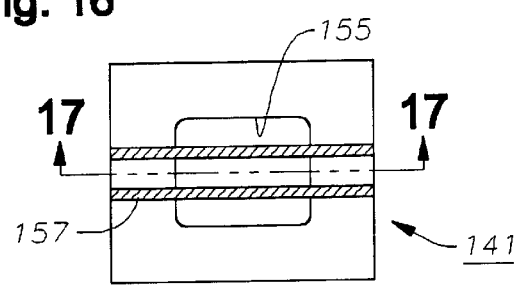
FIG. 16 is a plan view of the suspension of FIG. 14 at an intermediate stage of processing.
Figure 17:
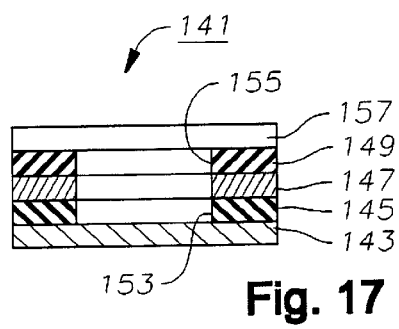
FIG. 17 is a sectional side view of the suspension of FIG. 16 taken along the line 17—17 of FIG. 16.
Figure 18:
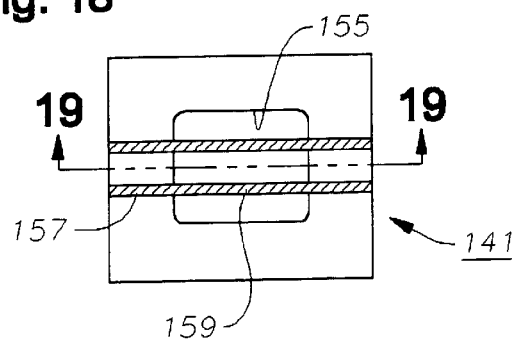
FIG. 18 is a plan view of the suspension of FIG. 14 after final processing.
Figure 19:
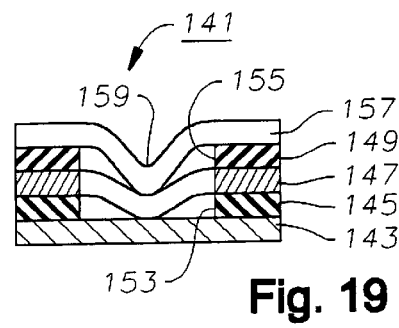
FIG. 19 is a sectional side view of the suspension of FIG. 18 taken along the line 19—19 of FIG. 18.

Prior to the formation of the laminate (FIGS. 14 and 15), polyimides 145, 149 are preformed with voids 153, 155, respectively. Voids 153, 155 may be formed by prestamping or pre-etching. After voids 153, 155 are made, the laminate of suspension 141 is formed. Coppers 151, 147 are subsequently etched to form conductors 157 (FIGS. 16 and 17). Next, the outer conductors 157 are deformed inward through void 155 in polyimide 149 toward and into contact with copper 147, and then deformed further inward until copper 147 contacts steel 143 to form electrostatic discharge shunts 159 between conductors 157, copper 147 and steel 143 (FIGS. 18 and 19).

The invention has many advantages. The voids allow dielectric material to be removed from the area beneath the conductors to simplify processing and reduce the cost of the suspensions. If the suspension is built using the plating method, the voids are also compatible with the plating process. The voids help create other features which are smaller than would otherwise be available by conventional methods. In the dielectric layers, the voids can be used to allow deformation of the conductors through the voids to form electrostatic discharge shunts with other conductive layers.

While the invention has been shown or described in only some of its forms, it should be apparent to those skilled in the art that it is not so limited, but is susceptible to various changes without departing from the scope of the invention. For example, as set forth in the appended claims, the layers of the integrated lead suspension may comprise a metal support layer, a pair of dielectric layers, and a pair of conductor layers.

We claim:

1. A method for manufacturing an integrated lead suspension for a hard disk drive, comprising:
   (a) providing a metal support layer, a pair of dielectric layers, and a pair of conductor layers;
   (b) forming a void in at least one of the dielectric layers; then
   (c) laminating each of the layers together to form a laminate such that the support layer and the conductor layers are separated from one another by at least one of the dielectric layers;
   (d) etching at least one of the conductor layers of the laminate of step (c) to form traces; and then
   (e) deforming at least one of the traces through said void toward and into contact with one of the support layer and the other of the conductor layers to form a shunt therebetween.

2. The method of claim 1 wherein step (c) comprises laminating all of the dielectric and conductor layers on one side of the support layer.

3. The method of claim 1 wherein step (b) comprises forming a void in each of the dielectric layers.

4. The method of claim 3 wherein step (c) comprises laminating all of the dielectric and conductor layers on one side of the support layer; and wherein step (e) comprises:
   deforming the traces through one of said voids toward and into contact with said other of the conductor layers, and continuing to deform the traces and said other of the conductor layers toward the support layer until said other of the conductor layers contacts the support layer to form a shunt between the traces, said other of the conductor layers and the support layer.

5. The method of claim 3 wherein step (c) comprises laminating one of the dielectric layers on each side of the support layer, and laminating one of the conductor layers on an outer surface of each of the dielectric layers this form the laminate.

6. The method of claim 5 wherein step (d) comprises etching each of the conductor layers to form traces; and wherein step (e) comprises
   deforming the traces of each of the conductor layers through the void in each of the dielectric layers, respectively, toward and into contact with the support layer to form shunts therebetween.

7. A method for manufacturing an integrated lead suspension for a hard disk drive, comprising:
   (a) providing a metal support layer, a pair of dielectric layers, and a pair of conductor layers;
   (b) forming a void in at least one of the dielectric layers; then
   (c) laminating one of the dielectric layers on each side of the support layer, and laminating one of the conductor layers on an outer surface of each of the dielectric layers to form a laminate;

(d) etching at least one of the conductor layers of the laminate of step (c) to form traces; and then (e) deforming at least one of the traces rough said void toward and into contact with the support layer to form a shunt therebetween.

8. The method of claim 7 wherein step (b) comprises forming a void in each of the dielectric layers.

9. The method of claim 8 wherein step (d) comprises etching each of the conductor layers to form traces; and wherein step (e) comprises deforming the traces of each of the conductor layers through the void in each of the dielectric layers, respectively, toward and into contact with the support layer to form shunts therebetween.

10. A method for manufacturing an integrated lead suspension for a hard disk drive, comprising:

(a) providing a metal support layer having two sides, a pair of dielectric layers, and a pair of conductor layers;

(b) forming a void in at least one of the dielectric layers; then (c) laminating each of the layers together to form a laminate such that the support layer and the conductor layers are separated from one another by at least one of the dielectric layers and all of the dielectric and conductor layers on one side of the support layer;

(d) etching at least one of the conductor layers of the laminate of step (c) to form traces; and then (e) deforming at least one of the traces through said void toward and into contact with the other of the conductor layers to form a shunt therebetween.

11. The method of claim 10 wherein step (b) comprises forming a void in each of the dielectric layers.

12. The method of claim 11 wherein step (e) comprises deforming the traces through one of said voids toward and into contact with said other of the conductor layers, and then deforming the traces and said other of the conductor layers toward the support layer until said other of the conductor layers contacts the support layer to form a shunt between the traces, said other of the conductor layers and the support layer.

13. The method of claim 10, further comprising the steps of forming the support layer from steel, forming the dielectric layer from a polymer, and forming the conductor layer from copper.

* * * * *

UNITED STATES PATENT AND TRADEMARK OFFICE
CERTIFICATE OF CORRECTION

PATENT NO.   : 6,576,148 B1
DATED        : June 10, 2003
INVENTOR(S)  : Shum et al.

It is certified that error appears in the above-identified patent and that said Letters Patent is hereby corrected as shown below:

Column 5,
Line 5, please replace the word "rough" with the word -- through --.

Signed and Sealed this

Twenty-third Day of September, 2003

JAMES E. ROGAN
*Director of the United States Patent and Trademark Office*